United States Patent
English et al.

(10) Patent No.: US 11,281,249 B2
(45) Date of Patent: Mar. 22, 2022

(54) VOLTAGE SENSITIVE CURRENT CIRCUIT

(71) Applicant: International Business Machines Corporation, Armonk, NY (US)

(72) Inventors: Erik English, Beacon, NY (US); Akil Khamisi Sutton, Dutchess County, NY (US); Pawel Owczarczyk, Highland, NY (US); Michael Sperling, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 10 days.

(21) Appl. No.: 16/578,613

(22) Filed: Sep. 23, 2019

(65) Prior Publication Data

US 2021/0089071 A1 Mar. 25, 2021

(51) Int. Cl.
*H03H 11/26* (2006.01)
*G05F 3/24* (2006.01)
(Continued)

(52) U.S. Cl.
CPC .............. *G05F 3/247* (2013.01); *G01R 17/02* (2013.01); *G01R 19/1659* (2013.01); *G01R 19/16519* (2013.01); *G01R 19/16547* (2013.01)

(58) Field of Classification Search
CPC ........ H03K 5/13; H03K 5/133; H03K 3/0322; H03K 5/131; H03H 11/265;
(Continued)

(56) References Cited

U.S. PATENT DOCUMENTS 4,128,816 A 12/1978 Shimotsuma
4,308,496 A 12/1981 Nagano
(Continued)

FOREIGN PATENT DOCUMENTS

CN 100428616 C 10/2008
CN 1938932 B 9/2010
(Continued)

OTHER PUBLICATIONS

Krishnaveni, S. & Bibin Sam Paul, S., "Desing of VCO Using Current Mode Logic With Low Supply Sensitivity," Feb. 2014, vol. 3, Issue 2, IJRET: International Journal of Reasearch in Engineering and Technology, pp. 528-530.
(Continued)

*Primary Examiner* — Quan Tra
(74) *Attorney, Agent, or Firm* — Cantor Colburn LLP; Jeffrey Ingalls

(57) ABSTRACT

Aspects of the invention include a first voltage sensitive circuit including first transistors, the first transistors being coupled together so as to be operatively coupled to a first current source. A second voltage sensitive circuit includes second transistors, the second transistors being coupled together so as to be operatively coupled to a second current source, the first voltage sensitive circuit being coupled to the second voltage sensitive circuit to form a delay chain, the first and second current sources being responsive to changes in voltage of a power supply according to a voltage reference. A voltage sensitive current reference module is coupled to the first and second current sources and configured to supply the voltage reference to the first and second current sources, the voltage sensitive current reference module being responsive to changes in the voltage of the power supply.

8 Claims, 6 Drawing Sheets

(51) Int. Cl.
  *G01R 17/02* (2006.01)
  *G01R 19/165* (2006.01)
(58) Field of Classification Search
  CPC .............. H03F 3/45183; H03F 3/45179; H03F 3/45085; H03F 2203/45702; H03F 3/45071
  USPC ............................ 327/261, 266, 563, 77, 543
  See application file for complete search history.

(56) References Cited

U.S. PATENT DOCUMENTS

| | | | |
|---|---|---|---|
| 4,473,762 A | | 9/1984 | Iwahashi et al. |
| 4,918,336 A | | 4/1990 | Graham et al. |
| 5,081,380 A | | 1/1992 | Chen |
| 5,197,033 A | | 3/1993 | Watanabe et al. |
| 5,510,729 A | | 4/1996 | Reymond |
| 5,610,547 A | | 3/1997 | Koyama et al. |
| 5,808,505 A | * | 9/1998 | Tsukada ................. G11C 5/146 327/535 |
| 5,856,757 A | * | 1/1999 | Eschauzier ......... H03F 3/45278 327/552 |
| 5,939,933 A | * | 8/1999 | Wang ................... H01L 27/092 257/E27.062 |
| 6,057,727 A | * | 5/2000 | Dautriche ............... G05F 3/262 323/313 |
| 6,137,720 A | | 10/2000 | Lancaster |
| 6,173,720 B1 | * | 1/2001 | Arndt ................ H01L 21/30604 134/1.3 |
| 6,433,624 B1 | * | 8/2002 | Grossnickle ............ G05F 3/262 327/543 |
| 6,476,656 B2 | * | 11/2002 | Dally ...................... G05F 3/262 327/276 |
| 6,496,056 B1 | | 12/2002 | Shoji |
| 6,661,253 B1 | | 12/2003 | Lee et al. |
| 6,686,792 B2 | | 2/2004 | Nakamiya et al. |
| 6,882,238 B2 | | 4/2005 | Kurd et al. |
| 7,142,400 B1 | * | 11/2006 | Williams ................ G06F 1/305 361/18 |
| 7,321,242 B2 | | 1/2008 | Mandegaran et al. |
| 7,525,345 B2 | | 4/2009 | Jang |
| 7,911,282 B2 | | 3/2011 | Fujino |
| 8,339,190 B2 | | 12/2012 | Otsuga et al. |
| 8,648,645 B2 | | 2/2014 | Konstadinidis et al. |
| 8,841,890 B2 | | 9/2014 | Ochoa et al. |
| 8,847,777 B2 | | 9/2014 | Ramaswami |
| 9,148,057 B2 | | 9/2015 | Kim |
| 9,229,465 B2 | | 1/2016 | Dhiman et al. |
| 9,473,127 B1 | | 10/2016 | Azin |
| 9,634,651 B1 | | 4/2017 | Tseng |
| 10,270,630 B2 | | 4/2019 | Yun et al. |
| 10,833,653 B1 | | 11/2020 | Sperling et al. |
| 2001/0054925 A1 | | 12/2001 | Dally et al. |
| 2002/0190283 A1 | | 12/2002 | Seno et al. |
| 2003/0109142 A1 | | 6/2003 | Cable et al. |
| 2003/0151920 A1 | * | 8/2003 | Shin ................... G03B 21/2046 362/282 |
| 2005/0094421 A1 | * | 5/2005 | Flore ....................... H02M 3/07 363/60 |
| 2005/0099210 A1 | | 5/2005 | Fetzer et al. |
| 2005/0099234 A1 | * | 5/2005 | Perner ................... G11B 27/22 330/261 |
| 2006/0055444 A1 | * | 3/2006 | Ogasawara ....... H03K 19/00384 327/328 |
| 2006/0076993 A1 | | 4/2006 | Teo et al. |
| 2006/0125529 A1 | | 6/2006 | Laulanet et al. |
| 2006/0170467 A1 | * | 8/2006 | Messager ............. H03K 17/223 327/143 |
| 2006/0232316 A1 | | 10/2006 | Nomura |
| 2007/0013414 A1 | | 1/2007 | Paillet et al. |
| 2007/0013454 A1 | | 1/2007 | Ji |
| 2007/0079147 A1 | | 4/2007 | Pyeon et al. |
| 2008/0007272 A1 | | 1/2008 | Ferraiolo et al. |
| 2008/0088365 A1 | * | 4/2008 | Jang ........................ G11C 7/02 327/563 |
| 2008/0218199 A1 | * | 9/2008 | Matsushima .......... H03K 17/16 326/26 |
| 2008/0246512 A1 | | 10/2008 | Seth et al. |
| 2008/0266916 A1 | * | 10/2008 | Yen ....................... H02M 3/073 363/74 |
| 2009/0058466 A1 | | 3/2009 | Parks et al. |
| 2009/0189702 A1 | | 7/2009 | Berthold et al. |
| 2010/0164538 A1 | | 7/2010 | Greimel-Rechling |
| 2012/0169391 A1 | | 7/2012 | Sofer et al. |
| 2013/0034139 A1 | | 2/2013 | Khlat et al. |
| 2013/0169330 A1 | | 7/2013 | Ma |
| 2013/0314020 A1 | | 11/2013 | Sugie |
| 2013/0342256 A1 | * | 12/2013 | Wadhwa .......... H03K 3/356104 327/277 |
| 2014/0145707 A1 | | 5/2014 | Tanabe et al. |
| 2014/0292420 A1 | | 10/2014 | Green et al. |
| 2015/0042386 A1 | | 2/2015 | Bhowmik et al. |
| 2016/0034014 A1 | | 2/2016 | Turullols et al. |
| 2016/0105189 A1 | * | 4/2016 | Maeda .................... H03L 7/095 327/157 |
| 2017/0060165 A1 | | 3/2017 | Kim et al. |
| 2018/0302073 A1 | | 10/2018 | Ko et al. |
| 2020/0028514 A1 | | 1/2020 | Hanke et al. |
| 2021/0064380 A1 | | 3/2021 | Mai et al. |

FOREIGN PATENT DOCUMENTS

| | | |
|---|---|---|
| CN | 205015388 U | 2/2016 |
| CN | 206331020 U | 7/2017 |
| KR | 101658783 B1 | 9/2016 |

OTHER PUBLICATIONS

List of IBM Patents or Patent Applications Treated as Related; (Appendix P); Date Filed: Sep. 23, 2019, 2 pages.
Michael Sperling et al., "Droop Detection Using Power Supply Sensitive Delay," U.S. Appl. No. 16/578,588, filed Sep. 23, 2019.
Michael Sperling et al., "Voltage Sensitive Delay," U.S. Appl. No. 16/578,597, filed Sep. 23, 2019.
Michael Sperling et al., "Voltage Starved Passgate With IR Drop," U.S. Appl. No. 16/578,622, filed Sep. 23, 2019.

* cited by examiner

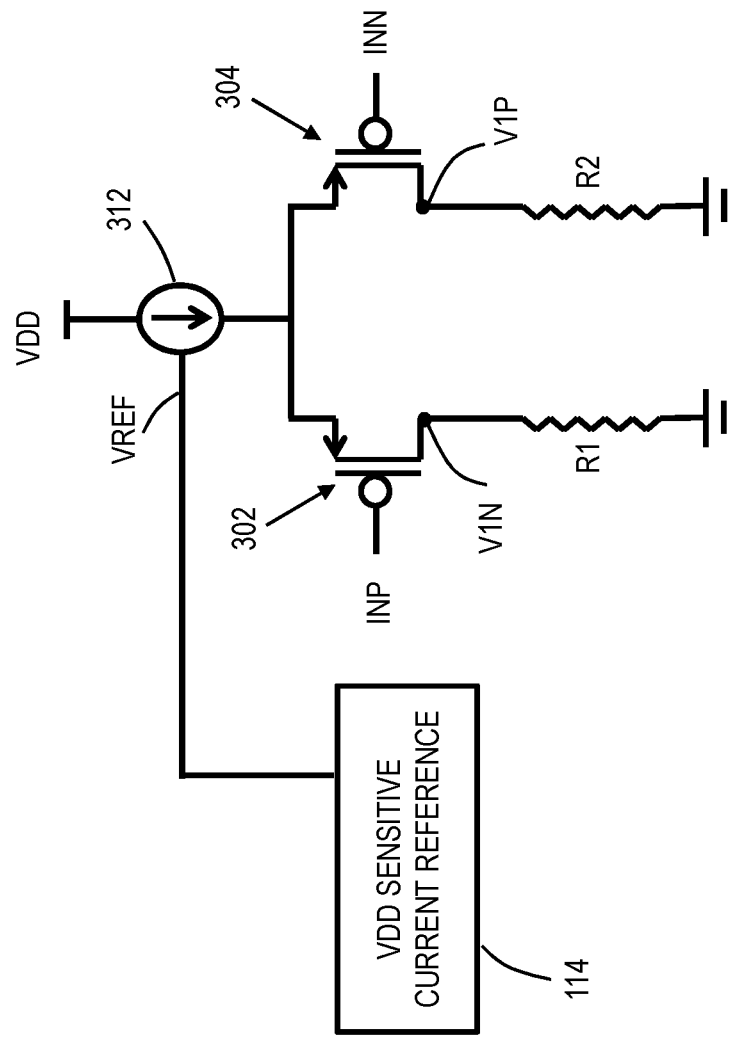

VOLTAGE SENSITIVE CURRENT CIRCUIT

BACKGROUND

The present invention generally relates to integrated circuits, and more specifically, to voltage sensitive current circuits.

In an electronic device, power is needed to run the device. Semiconductor devices, such as microprocessors, stand-alone and embedded memory devices, etc., receive power from a power supply. Microprocessors can execute instructions resulting in certain tasks being performed. In some cases, there can be a current spike or a change in current consumption because of the different instructions executed by the microprocessor, which causes voltage variation or spikes, known as droops on the power supply. This may occur because some instructions might require more power than others. A droop is defined as an output voltage change as a function of time and may include both under-voltage and over-voltage conditions.

SUMMARY

Embodiments of the present invention are directed to a voltage sensitive current circuit. A non-limiting example circuit includes a first voltage sensitive circuit including first transistors, the first transistors being coupled together so as to be operatively coupled to a first current source. The circuit includes a second voltage sensitive circuit comprising second transistors, the second transistors being coupled together so as to be operatively coupled to a second current source, the first voltage sensitive circuit being coupled to the second voltage sensitive circuit to form a delay chain, the first and second current sources being responsive to changes in voltage of a power supply according to a voltage reference. Also, the circuit includes a voltage sensitive current reference module coupled to the first and second current sources and configured to supply the voltage reference to the first and second current sources, the voltage sensitive current reference module being responsive to changes in the voltage of the power supply.

A non-limiting example method of forming a circuit includes forming a first voltage sensitive circuit including first transistors, the first transistors being coupled together so as to be operatively coupled to a first current source. The method includes forming a second voltage sensitive circuit including second transistors, the second transistors being coupled together so as to be operatively coupled to a second current source, the first voltage sensitive circuit being coupled to the second voltage sensitive circuit to form a delay chain, the first and second current sources being responsive to changes in voltage of a power supply according to a voltage reference. Also, the method includes coupling a voltage sensitive current reference module to the first and second current sources, the voltage sensitive current reference module being configured to supply the voltage reference to the first and second current sources, the voltage sensitive current reference module being responsive to changes in the voltage of the power supply.

A non-limiting example delay circuit includes a first voltage sensitive circuit coupled to a second voltage sensitive circuit, so as to form a delay chain, the first and second voltage sensitive circuits being coupled to a power supply. The delay circuit includes current sources coupled to the first and second voltage sensitive circuits, the current sources being controlled based a voltage reference. Also, the delay circuit includes a voltage sensitive current reference module coupled to the current sources, the voltage sensitive current reference module configured to output the voltage reference to the current sources based on changes in voltage of the power supply.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 3 illustrates a block diagram of example circuit which can replace circuits in FIG. 1 in accordance with one or more embodiments of the present invention;

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention provide a delay circuit that makes delay more sensitive to changes in voltage (VDD) of a power supply. The delay circuit becomes faster (i.e., delay decreases) as the voltage increases, and the delay circuit becomes slower (i.e., delay increases) as the voltage decreases (i.e., voltage drops). One or more embodiments of the invention can be utilized in the fixed delay part of a digital droop sensor. Further embodiments are directed to making the current sensitive to changes in voltage. One or more embodiments of the invention may include current mode logic (CML) circuits coupled to a current source, with a VDD voltage sensitive current reference controlling the current source. In addition, one or more embodiments of the invention may use current starved inverters to make the current sensitive to changes in VDD.

CML topologies in the state-of-the-art focus on reducing sensitivity to process, voltage, and temperature (PVT) variations (e.g., fabrication misalignment, voltage supply variations, and temperature variations), and do not have a current source sensitive to changes in VDD. Particularly, voltage-insensitive delay is what is typically desired in electronic devices such as microprocessors or processors, meaning that they are designed so that delay of the clock signal is not sensitive to changes in voltage. However, microprocessors need to detect voltage droops or drops in the voltage supply (e.g., voltage VDD), and this can be accomplished by making delays sensitive to voltage in accordance with one or more embodiments of the invention. In one or more embodiments, the delay circuit can be utilized in a digital droop sensor that recognizes when the voltage is drooping by making delay of the clock signal increase in relation to a decrease in voltage and vice versa. For example, a clock signal travels through a delay line and (either one or more cycles later) is latched along a string of latches spaced out by minimum delays. The location of the edge (e.g., rising edge or falling edge of a cyclical waveform) of the clock signal in the string of latches is a proxy for the power supply voltage, as changes in power supply slow down or speed up the delays along the path.

Figure 1:
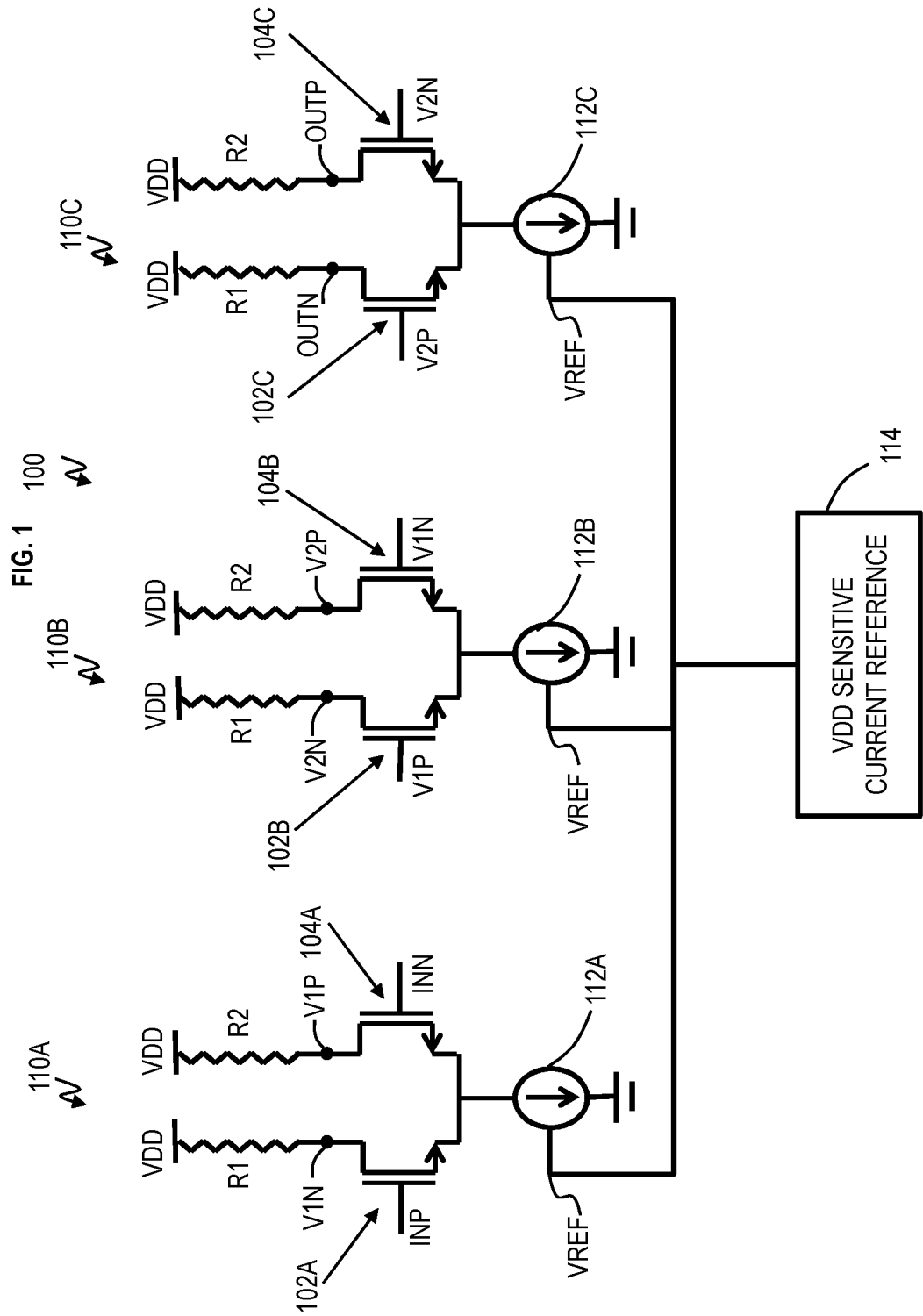
FIG. 1 illustrates a block diagram of a voltage sensitive delay circuit composed of current mode logic devices in accordance with one or more embodiments of the present invention.

Turning now to FIG. 1, a circuit 100 for providing voltage sensitive delay is generally shown in accordance with one or more embodiments of the present invention. The circuit 100 is a delay circuit which makes delay more sensitive to changes in voltage of a power supply (e.g., voltage VDD) by having voltage sensitive circuits 110A, 110B, and 110C, operatively coupled together as a delay chain or oscillator. The voltage sensitive circuits 110A, 110B, and 110C can generally be referred to as voltage sensitive circuits 110. It should be appreciated that fewer or more voltage sensitive circuits may be utilized and operatively connected in FIG. 1.

The voltage sensitive circuits 110A, 110B, and 110C are CML circuits. Each of the voltage sensitive circuits 110A, 110B, and 110C respectively comprises two n-type field effect transistors (NFETs), such as NFETs 102A and 104A, NFETs 102B and 104B, NFETs 102C and 104C, which are coupled together at their sources while their drains are separately connected to one end of respective resistors R1 and R2. For each voltage sensitive circuit 110A, 110B, and 110C, the other ends of the resistors R1 and R2 opposite the drains are connected to voltage VDD. In each voltage sensitive circuit 110A, 110B, and 110C, the sources of the NFETs are coupled to ground through a respective current source 112A, 112B, and 112C each of which is sensitive to changes in VDD. The current sources 112A, 112B, and 112C are each coupled to a voltage (e.g., voltage VDD) sensitive current reference module 114 in order to supply voltage reference (VREF) to each of the current sources 112A, 112B, and 112C. Further regarding the voltage sensitive current reference module 114 is discussed in FIGS. 4A, 4B, and 4C.

As current mode logic, or source-coupled logic (SCL), each voltage sensitive circuit 110A, 110B, and 110C has a differential output respectively designated as differential output V1N and V1P, differential output V2N and V2P, and differential output OUTN and OUTP; the differential output of one voltage sensitive circuit 110 couples to the gate of the next voltage sensitive circuit 110 as a differential input, thereby forming a chain of voltage sensitive circuits 110. For example, the differential output V1N and V1P of voltage sensitive circuit 110A couples to the gates (e.g., differential inputs) of NFETs 102B and 104B of voltage sensitive circuit 110B, just as the differential output V2N and V2P of voltage sensitive circuit 110B couples to the gates of NFETs 102C and 104C of voltage sensitive circuit 110C. A differential signal input at differential inputs INP and INN of voltage sensitive circuit 110A is output at differential outputs OUTN and OUTP of voltage sensitive circuit 110C according to one or more embodiments of the invention.

Although the voltage sensitive circuits 110 are illustrated with NFETs, it should be appreciated that p-type field effect transistors (PFETs) can be utilized as depicted in the embodiment shown in FIG. 3. FIG. 3 illustrates a voltage sensitive circuit 310 as a CML circuit, and each of the voltage sensitive circuits 110A, 110B, and 110C can be separately replaced with the voltage sensitive circuit 310 and analogously connected to form a delay chain as discussed in FIG. 1. In FIG. 3, voltage sensitive circuit 310 includes two PFETs 302 and 304 coupled together at their sources while their drains are separately connected to one end of respective resistors R1 and R2. For voltage sensitive circuit 310, the other ends of the resistors R1 and R2 opposite the drains are connected to ground. The sources of the PFETs 302 and 304 are coupled to voltage VDD through a current source 312 sensitive to changes in voltage VDD. The current source 312 receives VREF from the voltage VDD voltage sensitive current reference module 114, as discussed for current sources 112A, 112B, and 112B. The voltage sensitive circuit 310 has a differential output designated as differential output V1N and V1P and gate inputs designated as V1N and V1P. For three voltage sensitive circuits 310 connected in a delay chain, the differential output of one voltage sensitive circuit 310 is connected to the gates of the next voltage sensitive circuit 310 in a manner such as that discussed above in reference to FIG. 1.

Figure 2:
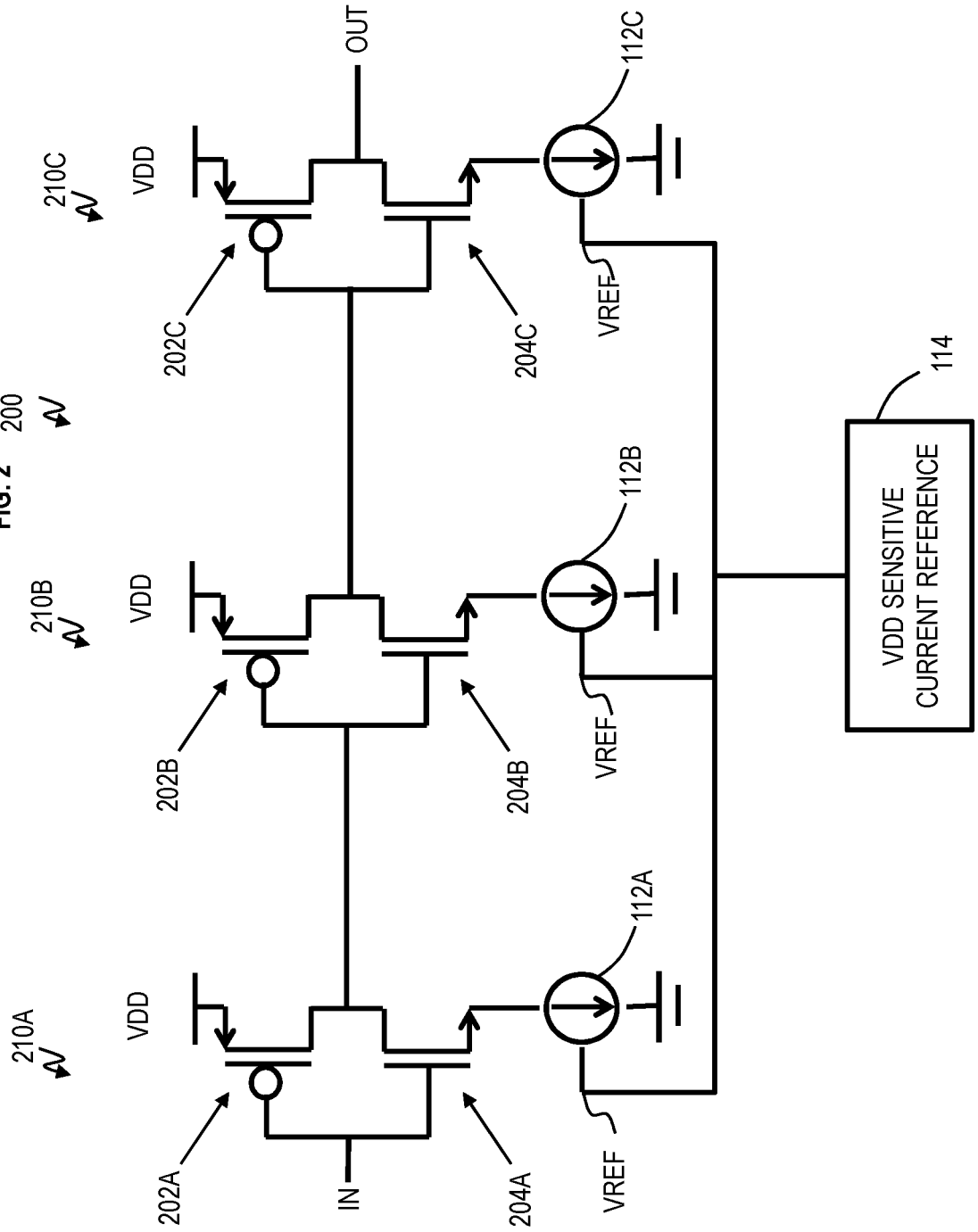
FIG. 2 illustrates a block diagram of a voltage sensitive delay circuit composed of current starved inverters in accordance with one or more embodiments of the present invention.

Turning to FIG. 2, a circuit 200 is illustrated for providing voltage sensitive delay in accordance with one or more embodiments of the present invention. As discussed in FIG. 1, the circuit 200 is a delay circuit which makes delay more sensitive to changes in voltage of a power supply (e.g., voltage VDD) by having voltage sensitive circuits 210A, 210B, and 210C operatively coupled together as a delay chain. The voltage sensitive circuits 210A, 210B, and 210C, generally referred to as voltage sensitive circuits 210, can include inverters or passgates which are current controlled. It should be appreciated that fewer or more voltage sensitive circuits may be utilized and operatively connected in FIG. 2.

Each voltage sensitive circuit 210A, 210B, and 210C includes inverters formed with the input of one inverter coupled to the output of the next inverter, and each inverter is formed of a PFET coupled to an NFET, such as PFET 202A coupled to NFET 204A, PFET 202B coupled to NFET 204B, and PFET 202C coupled to NFET 204C. For each inverter, the source of the PFET is coupled to voltage VDD and the source of the NFET is coupled to respective current sources 112A, 112B, and 112C sensitive to voltage VDD for each of the voltage sensitive circuits 210; the drains and gates of the PFET and NFET are coupled together. Although not shown, it should be appreciated that the current sources 112A, 112B, and 112C may be moved from the source of the NFETs to the source of the PFETS in voltage sensitive circuits 210A, 210B, and 210C while still functioning in accordance with embodiments. If the current sources 112A, 112B, and 112C are moved from NFET to PFET, the source of the PFET can be coupled to voltage VDD through the current source sensitive to voltage VDD, and the source of the NFET can be coupled to ground, while their drains and gates are coupled together. Regardless of which end of the inverters that the current sources 112A, 112B, and 112C are connected to, embodiments of the invention provide current controlled inverters where the delay is controlled by the current and that current is made sensitive to voltage VDD.

As discussed herein, the VDD voltage sensitive current reference module 114 is coupled to the current sources 112A, 112B, 112C, and 312 along with the voltage supply of voltage VDD. The current sources sensitive to voltage VDD can be implemented as an NFET or PFET. For example, the VDD voltage sensitive current reference module 114 outputs a voltage VREF to the gate of the current source (i.e., using the NFET as the current source) according to the changes in voltage VDD, such that the current through the current source is sensitive/responsive to changes in voltage VDD, meaning that the current increases or decreases according to the voltage VDD. The VDD voltage sensitive current reference module 114 is coupled to voltage VDD so as to control changes in the voltage to the gate of the current source (i.e., using NFET as the current source), and the VDD voltage sensitive current reference module 114 outputs a lower value for voltage VREF when voltage VDD decreases and outputs a higher value for voltage VREF when VDD increases. Therefore, a drop in voltage VDD slows the circuits 100 and 200 which increases delay, while an increase in voltage VDD speeds up the circuits 100 and 200 which decreases the delay.

Figure 4B:
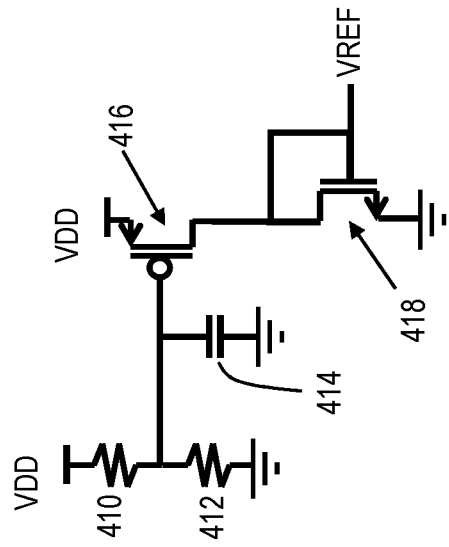
FIG. 4B illustrates a block diagram of a voltage sensitive current reference in accordance with one or more embodiments of the present invention.
Figure 4A:
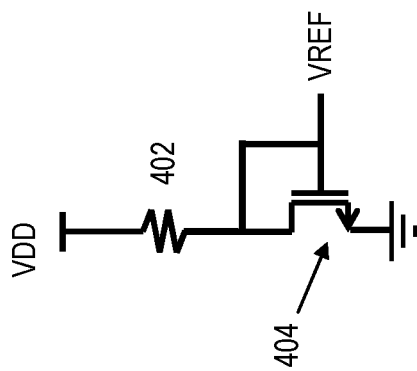
FIG. 4A illustrates a block diagram of a voltage sensitive current reference in accordance with one or more embodiments of the present invention.
Figure 4C:
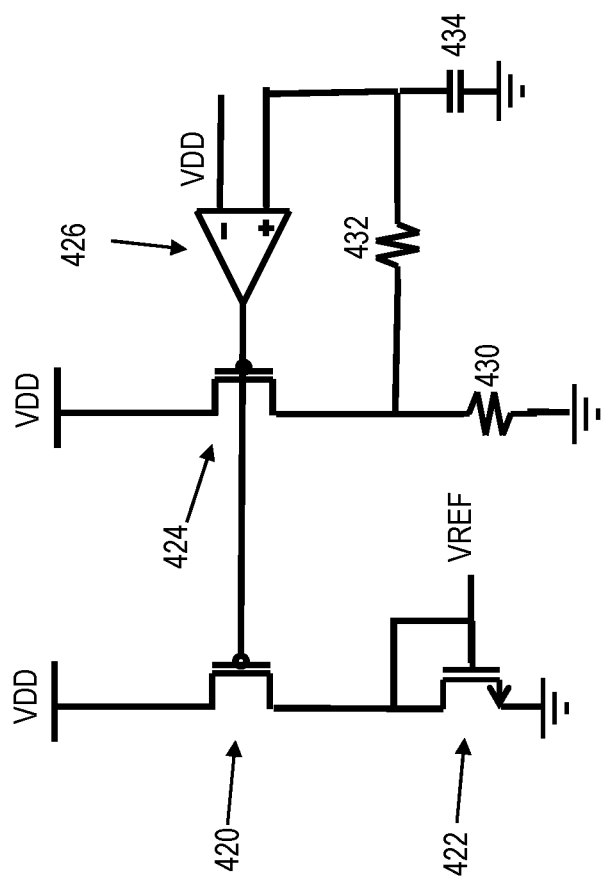
FIG. 4C illustrates a block diagram of a voltage sensitive current reference in accordance with one or more embodiments of the present invention.

Example VDD sensitive current reference modules in accordance with one or more embodiments of the invention are illustrated in FIGS. 4A, 4B, and 4C. FIG. 4A illustrates an example VDD voltage sensitive current reference module 114 with an NFET 404 having its drain coupled to voltage VDD through a resistor 402. The gate and drain of NFET 404 are coupled at a node which also outputs voltage VREF. The source of NFET 404 is coupled to ground.

FIG. 4B illustrates an example VDD voltage sensitive current reference module 114 with a PFET 416 and NFET 418 coupled at their drains for a node, while the gate and drain of the NFET 418 are also coupled to the node in order to output voltage VREF. Resistors 410 and 412 are connected in series, and the gate of PFET 416 is coupled to the connected ends of resistors 410 and 412 along with capacitor 414. The opposite end of capacitor 414 is connected to ground. The opposite end of resistor 410 is connected to voltage supply (e.g., voltage VDD) while the opposite end of resistor 412 is connected to ground.

FIG. 4C illustrates an example VDD voltage sensitive current reference module 114 with an amplifier 426 (e.g., an operational amplifier) having its output coupled to gates of PFET 420 and PFET 424. The inverting input terminal (−) of amplifier 426 is coupled to voltage supply (e.g., voltage VDD), while the noninverting input (+) is coupled to a node connecting resistor 432 and capacitor 434. The opposite end of capacitor 434 is coupled to ground. One end (e.g., source) of PFET 424 is coupled to a the power supply (e.g., voltage VDD), and the opposite end (e.g., drain) of PFET 424 is coupled to a node connecting resistor 432 and resistor 430. The opposite end of resistor 430 is connected to ground. One end (e.g., source) of PFET 420 is coupled to voltage supply (e.g., voltage VDD), while the other end (e.g., drain) is coupled to a node connecting the gate and drain of the NFET 422 in which this node outputs voltage VREF, as illustrated in FIG. 4C.

As an example scenario for operating the circuit 100 in FIG. 1, a differential signal applied to differential inputs INP and INN is delayed through each of circuits 110A, 110B, and 110C dependent on the reference current supplied by current sources 112A, 112B, and 112C. A decrease in voltage VREF from the VDD sensitive current reference 114 leads to a subsequent decrease in the current provided by current sources 112A, 112B, and 112C. This decrease in current increases the time taken to charge and discharge each of the differential NFET pairs, INN and INP, V1N and V1P, V2N and V2P, which results in an increase in delay through each of circuits 110A, 110B, and 110C. Conversely an increase in the VREF voltage increases the current by current sources 112A, 112B, and 112C which then decreases the charging and discharging time of each of differential NFET pairs and decreases the delay through each of circuits 110A, 110B, and 110C.

As an example scenario for operating the circuit 200, a signal at input IN of circuit 210A is delayed through each of circuits 210A, 210B and 210C dependent on the reference current supplied by current sources 112A, 112B and 112C. A decrease in voltage VREF from the VDD sensitive current reference 114 leads to a subsequent decrease in the amount of current available to NFET devices 204A, 204B, and 204C, to discharge the drains of circuits 210A, 210B, and 210C. As less current is available, the drains of NFET devices 204A, 204B, and 204C discharge more slowly which in turn also delays the turning on of the PFET in the proceeding stage. Consequently, a decrease in the VREF voltage increases the delay through each of circuits 210A, 210B, and 210C. Conversely, an increase in the VREF voltage decreases the delays through each of circuits 210A, 210B, and 210C.

Figure 5:
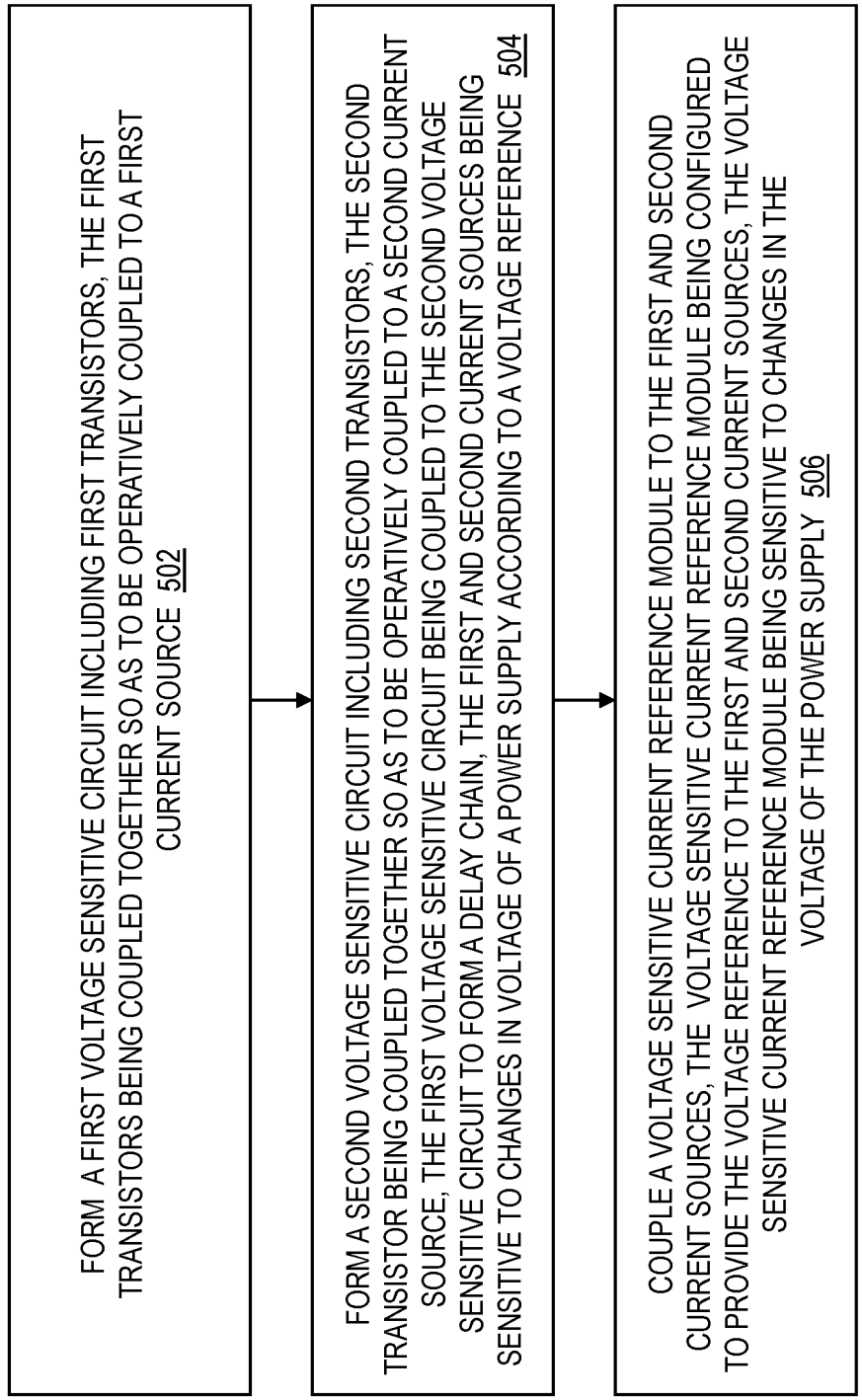
FIG. 5 illustrates a flow diagram of a method for configuring a circuit in accordance with one or more embodiments of the present invention.

FIG. 5 illustrates a flow diagram of a method 500 for configuring the circuit 100, 200 in accordance with one or more embodiments of the invention. Reference can be made to FIGS. 1, 2, 3, 4A, 4B, and 4C discussed herein. At block 502, the method includes forming a first voltage sensitive circuit (e.g., voltage sensitive circuits 110A and 210A) including first transistors (e.g., NFETs 102A and 104A in circuit 100 and PFET 202A and NFET 204A in circuit 200), the first transistors being coupled together so as to be operatively coupled to a first current source (e.g., current source 112A). At block 504, the method includes forming second voltage sensitive circuit (e.g., voltage sensitive circuits 110B and 210B) including second transistors (e.g., NFETs 102B and 104B in circuit 100 and PFET 202B and NFET 204B in circuit 200), the second transistor being coupled together so as to be operatively coupled to a second current source (e.g., current source 112B), the first voltage sensitive circuit being coupled to the second voltage sensitive circuit to form a delay chain, the first and second current sources being sensitive/responsive to changes in voltage of a power supply (e.g., voltage VDD) according to a voltage reference (e.g., VREF). At block 506, the method includes coupling a voltage sensitive current reference module 114 to the first and second current sources (e.g., current sources 112A, 112B, etc.), the voltage sensitive current reference module 114 being configured to supply the voltage reference (e.g., VREF) to the first and second current sources, the voltage sensitive current reference module being sensitive/responsive to changes in the voltage of the power supply (e.g., voltage VDD).

In accordance with one or more embodiments of the invention, each of the first transistors is an n-type field effect transistor (NFET) and each of the second transistors is an NFET, as illustrated in FIG. 1. The first transistors are first NFETs having sources coupled to the first current source and the second transistors are second NFETs having sources coupled to the second current source. The first voltage sensitive circuit (e.g., voltage sensitive circuits 110A) comprises a first differential output (e.g., differential output V1N and V1P) and the second voltage sensitive circuit (e.g., voltage sensitive circuits 110B) comprises a second differential output (e.g., differential output V2N and V2P). The first differential output couples to gates of the second transistors, and the second differential output couples to gates of the first transistors, for example, assuming two voltage sensitive circuits. However, it should be appreciated that more than two voltage sensitive circuits can be utilized to form a delay chain. The first voltage sensitive circuit includes first resistor elements (e.g., resistor R1 and R2) coupled to the first transistors (e.g., NFETs 102A and 104A) and the second voltage sensitive circuit incudes second resistor elements (e.g., resistors R1 and R2) coupled to the second transistors (e.g., NFETs 102B and 104B).

In accordance with one or more embodiments of the present invention, the voltage sensitive current reference module 114 is configured to output a lower value for the voltage reference (e.g., VREF) in response to a decrease in the voltage of the power supply (e.g., voltage VDD), thereby increasing a delay. The voltage sensitive current reference module 114 is configured to output a higher value for the voltage reference (e.g., VREF) in response to an increase in the voltage of the power supply, thereby decreasing a delay.

In accordance with one or more embodiments of the present invention, the first voltage sensitive circuit (e.g., voltage sensitive circuits 210A) includes a first inverter and the second voltage sensitive circuit (e.g., voltage sensitive circuits 210B) includes a second inverter coupled to the first inverter, as illustrated in FIG. 2. The first inverter is coupled to the first current source (e.g., current source 112A) and the second inverter is coupled to the second current source (e.g., current source 112B), as illustrated in FIG. 2. The first inverter and the second inverter each include a PFET (e.g., PFETs 202A, 202B) coupled to an NFET (e.g., NFETs 204A, 204B).

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A circuit comprising:
a first voltage sensitive circuit comprising first transistors, the first transistors comprising a first p-type transistor and a first n-type transistor coupled together at both drains and gates such that the first n-type transistor is directly connected to a first current source, the first p-type transistor being coupled directly to a power supply;
a second voltage sensitive circuit comprising second transistors, the second transistors comprising a second p-type transistor and a second n-type transistor coupled together at both drains and gates such that the second n-type transistor is directly connected to a second current source, the second p-type transistor being directly coupled to the power supply, the first voltage sensitive circuit being coupled to the second voltage sensitive circuit to form a delay chain, the first and second current sources being responsive to changes in voltage of the power supply according to a voltage reference; and
a voltage sensitive current reference module coupled to the first and second current sources and configured to supply the voltage reference to the first and second current sources, the voltage sensitive current reference module being responsive to changes in the voltage of the power supply, the voltage sensitive current reference module comprising an n-type transistor having a drain coupled to another drain of a p-type transistor, wherein the drain of the n-type transistor and the another drain of the p-type transistor are coupled to the first and second current sources, a source of the p-type transistor being directly coupled to the power supply, the p-type transistor having a gate coupled to a two-terminal capacitor and a junction of two two-terminal resistive elements, a first one of the two-terminal resistive elements being coupled to the power supply, a second one of the two-terminal resistive elements being coupled to ground, one terminal of the two-terminal capacitor being coupled to ground while a second terminal of the two-terminal capacitor being coupled to the gate of the p-type transistor.

2. The circuit of claim 1, wherein the voltage sensitive current reference module is configured to output a lower value for the voltage reference in response to a decrease in the voltage of the power supply, thereby increasing a delay.

3. The circuit of claim 1, wherein the voltage sensitive current reference module is configured to output a higher value for the voltage reference in response to an increase in the voltage of the power supply, thereby decreasing a delay.

4. The circuit of claim 1, wherein the first voltage sensitive circuit comprises a first inverter as the first transistors and the second voltage sensitive circuit comprises a second inverter as the second transistors coupled to the first inverter.

5. The circuit of claim 4, wherein the first inverter is coupled to the first current source and the second inverter is coupled to the second current source.

6. A method of forming a circuit, the method comprising:
forming a first voltage sensitive circuit comprising first transistors, the first transistors comprising a first p-type transistor and a first n-type transistor coupled together at both drains and gates such that the first n-type transistor is directly connected to a first current source, the first p-type transistor being coupled directly to a power supply;
forming a second voltage sensitive circuit comprising second transistors, the second transistors comprising a second p-type transistor and a second n-type transistor coupled together at both drains and gates such that the second n-type transistor is directly connected to a second current source, the second p-type transistor being coupled directly to the power supply, the first voltage sensitive circuit being coupled to the second voltage sensitive circuit to form a delay chain, the first and second current sources being responsive to changes in voltage of the power supply according to a voltage reference; and
coupling a voltage sensitive current reference module to the first and second current sources, the voltage sensitive current reference module being configured to supply the voltage reference to the first and second current sources, the voltage sensitive current reference module being responsive to changes in the voltage of the power supply, the voltage sensitive current reference module comprising an n-type transistor having a drain coupled to another drain of a p-type transistor, wherein the drain of the n-type transistor and the another drain of the p-type transistor are coupled to the first and second current sources, a source of the p-type transistor being coupled directly to the power supply, the p-type transistor having a gate coupled to a two-terminal capacitor and a junction of two two-terminal resistive elements, a first one of the two-terminal resistive elements being coupled to the power supply, a second one of the two-terminal resistive elements being coupled to ground, one terminal of the two-terminal capacitor being coupled to ground while a second terminal of the two-terminal capacitor being coupled to the gate of the p-type transistor.

7. The method of claim 6, wherein:
the voltage sensitive current reference module is configured to output a lower value for the voltage reference in response to a decrease in the voltage of the power supply, thereby increasing a delay; and
the voltage sensitive current reference module is configured to output a higher value for the voltage reference in response to an increase in the voltage of the power supply, thereby decreasing the delay.

8. The method of claim 6, wherein:
the first voltage sensitive circuit comprises a first inverter as the first transistors and the second voltage sensitive circuit comprises a second inverter as the second transistors coupled to the first inverter; and
the first inverter is coupled to the first current source and the second inverter is coupled to the second current source.

* * * * *